(12) United States Patent
Kim

(10) Patent No.: US 12,727,359 B2
(45) Date of Patent: Sep. 1, 2026

(54) DISPLAY APPARATUS

(71) Applicant: Samsung Display Co., Ltd., Yongin-si (KR)

(72) Inventor: Jaehoon Kim, Yongin-si (KR)

(73) Assignee: Samsung Display Co., Ltd., Yongin-si (KR)

(*) Notice: Subject to any disclaimer, the term of this patent is extended or adjusted under 35 U.S.C. 154(b) by 296 days.

(21) Appl. No.: 18/421,276

(22) Filed: Jan. 24, 2024

(65) Prior Publication Data

US 2025/0024729 A1 Jan. 16, 2025

(30) Foreign Application Priority Data

Jul. 13, 2023 (KR) ........................ 10-2023-0091350

(51) Int. Cl.
*H10K 59/38* (2023.01)
*H10K 59/122* (2023.01)

(52) U.S. Cl.
CPC ........... *H10K 59/38* (2023.02); *H10K 59/122* (2023.02)

(58) Field of Classification Search
CPC .......... H10K 50/844–8445; H10K 50/85–858; H10K 59/38; H10K 59/873–8731; H10K 59/875–879
See application file for complete search history.

(56) References Cited

U.S. PATENT DOCUMENTS 7,641,976 B2 1/2010 Lamberson et al.
9,299,749 B2 3/2016 Han et al.
10,622,413 B2 4/2020 Sakairi
10,956,708 B2 3/2021 Jang et al.
2022/0123265 A1 4/2022 Na

FOREIGN PATENT DOCUMENTS

CN 217640576 U 10/2022
JP 2017-009625 A 1/2017
KR 10-0911965 B1 8/2009
KR 10-2015-0010232 A 1/2015
KR 10-2022-0050298 A 4/2022

OTHER PUBLICATIONS

Reed T. Heintzkill, "fabrication of silver-doped zinc oxide thin films Through optimized sol-gel deposition and nanoparticle wetting process" A Thesis Submitted in Partial Fulfillment of the Requirements for the Degree of Master of Science in Engineering at The University of Wisconsin—Milwaukee, Dec. 2018, 212 pages.

*Primary Examiner* — Evan G Clinton

(74) *Attorney, Agent, or Firm* — Womble Bond Dickinson (US) LLP

(57) ABSTRACT

A display apparatus includes: a first substrate; a light-emitting diode layer over the first substrate and including a light-emitting diode configured to emit light of a wavelength in a first wavelength band; a color-converting layer on the light-emitting diode layer and including a quantum-dot layer or a light-transmissive layer overlapping the light-emitting diode; a second substrate over the first substrate between the light-emitting diode layer and the color-converting layer and including a groove in a surface thereof facing the first substrate, the groove overlapping the light-emitting diode; and an ion-supplying layer filling the groove.

20 Claims, 12 Drawing Sheets

DISPLAY APPARATUS

CROSS-REFERENCE TO RELATED APPLICATION

The present application claims priority to and the benefit of Korean Patent Application No. 10-2023-0091350, filed on Jul. 13, 2023, in the Korean Intellectual Property Office, the entire disclosure of which is incorporated herein by reference.

BACKGROUND

1. Field

Aspects of one or more embodiments relate to a display apparatus.

2. Description of the Related Art

Generally, a display apparatus has a plurality of pixels. In a full-color display apparatus, a plurality of pixels may be configured to emit light of different colors. For this purpose, at least some of the pixels in the display apparatus include a color converter. Accordingly, light of a wavelength in a first wavelength band generated from a light-emitting part of some pixels is converted into light of a wavelength in a second wavelength band while passing through a corresponding color converter and then emitted to the outside.

The above information disclosed in this Background section is only for enhancement of understanding of the background and therefore the information discussed in this Background section does not necessarily constitute prior art.

SUMMARY

Aspects of one or more embodiments relate to a display apparatus, and for example, to a display apparatus capable of displaying relatively high-quality images.

However, because light efficiency is low in a display apparatus according to the related art, high-quality images may not be displayed thereon.

Aspects of one or more embodiments include a display apparatus capable of displaying relatively high-quality images. However, such characteristics are merely examples, and embodiments according to the present disclosure are not limited thereto.

Additional aspects will be set forth in part in the description which follows and, in part, will be apparent from the description, or may be learned by practice of the presented embodiments of the disclosure.

According to one or more embodiments, a display apparatus includes a first substrate, a light-emitting diode layer over the first substrate and including a light-emitting diode configured to emit light of a wavelength in a first wavelength band, a color-converting layer on the light-emitting diode layer and including a quantum-dot layer or a light-transmissive layer overlapping the light-emitting diode, a second substrate over the first substrate to be between the light-emitting diode layer and the color-converting layer and including a groove in a surface thereof facing the first substrate, the groove overlapping the light-emitting diode, and an ion-supplying layer filling the groove.

According to some embodiments, the ion-supplying layer may include a polymer having a carboxyl group.

According to some embodiments, the ion-supplying layer may include polyacrylic acid.

According to some embodiments, the display apparatus may further include a sealing member between the first substrate and the second substrate.

According to some embodiments, the sealing member may define a cavity between the first substrate and the second substrate.

According to some embodiments, the color-converting layer and the ion-supplying layer may face each other with the cavity therebetween.

According to some embodiments, the sealing member may include a light-curable resin.

According to some embodiments, the surface of the second substrate in a direction to the first substrate may be spaced apart in a thickness direction from a surface of the color-converting layer in a direction to the second substrate.

According to some embodiments, a distance between a surface of the ion-supplying layer in a direction to the first substrate and a surface of the color-converting layer in a direction to the second substrate may be greater than or equal to a distance between a surface of the second substrate in the direction to the first substrate and a surface of the color-converting layer in the direction to the second substrate.

According to one or more embodiments, a display apparatus includes a first substrate, a light-emitting diode layer over the first substrate and including a first light-emitting diode, a second light-emitting diode, and a third light-emitting diode each configured to emit light of a wavelength in a first wavelength band, an encapsulation layer on the light-emitting diode layer, a bank layer on the encapsulation layer and defining a first bank opening overlapping the first light-emitting diode, a second bank opening overlapping the second light-emitting diode, and a third bank opening overlapping the third light-emitting diode, a first quantum-dot layer in the first bank opening and configured to convert light of a wavelength in the first wavelength band into light of a wavelength in a second wavelength band, a second quantum-dot layer in the second bank opening and configured to convert light of a wavelength in the first wavelength band into light of a wavelength in a third wavelength band, a second substrate over the first substrate such that the light-emitting diode layer, the encapsulation layer, and the bank layer are between the first substrate and the second substrate, wherein the second substrate includes a first groove overlapping the first light-emitting diode, a second groove overlapping the second light-emitting diode, and a third groove overlapping the third light-emitting diode, each of the first groove, the second groove, and the third groove being defined in a surface thereof in a direction to the first substrate, and an ion-supplying layer including a first organic material layer filling the first groove, a second organic material layer filling the second groove, and a third organic material layer filling the third groove.

According to some embodiments, the ion-supplying layer may include a polymer having a carboxyl group.

According to some embodiments, the ion-supplying layer may include polyacrylic acid.

According to some embodiments, the display apparatus may further include a sealing member between the first substrate and the second substrate, wherein the sealing member may define a cavity between the first substrate and the second substrate.

According to some embodiments, the cavity may be between the first quantum-dot layer and the first organic material layer and between the second quantum-dot layer and the second organic material layer.

According to some embodiments, the display apparatus may further include a light-transmissive layer in the third bank opening and configured to transmit light of a wavelength in the first wavelength band.

According to some embodiments, the first wavelength band may be in a range of 450 nm (or about 450) nm to 495 nm (or about 495 nm), the second wavelength band may be in a range of 625 nm (or about 625 nm) to 780 nm (or about 780 nm), and the third wavelength band may be in a range of 495 nm (or about 495 nm) to 570 nm (or about 570 nm).

According to some embodiments, a thickness of the third organic material layer may be different from a thickness of the first organic material layer and a thickness of the second organic material layer.

According to some embodiments, a thickness of the third organic material layer may be greater than a thickness of the first organic material layer and a thickness of the second organic material layer.

According to some embodiments, a thickness of the first organic material layer may be equal (or substantially equal) to a thickness of the second organic material layer.

According to some embodiments, a surface of the second substrate in a direction to the first substrate may be spaced apart from each of a surface of the first quantum-dot layer in a direction to the second substrate, and a surface of the second quantum-dot layer in the direction to the second substrate.

These and/or other aspects will become apparent and more readily appreciated from the following detailed description of the embodiments, the accompanying drawings, and claims.

BRIEF DESCRIPTION OF THE DRAWINGS

The above and other aspects, features, and characteristics of certain embodiments of the disclosure will be more apparent from the following description taken in conjunction with the accompanying drawings, in which.

DETAILED DESCRIPTION

Figure 1:
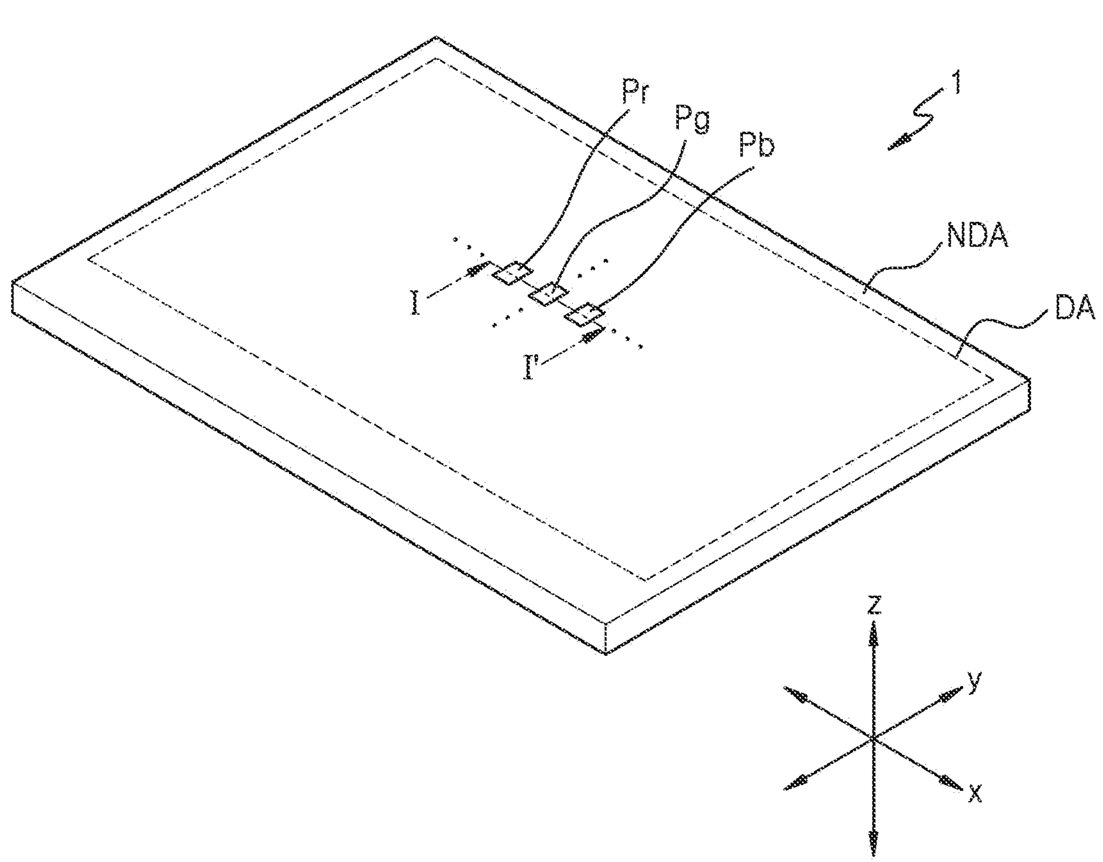
FIG. 1 is a schematic perspective view of a display apparatus according to some embodiments.

Reference will now be made in more detail to aspects of some embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or any combination of a, b, and/or c.

As the disclosure allows for various changes and numerous embodiments, certain embodiments will be illustrated in the drawings and described in the written description. Effects and features of the disclosure, and methods for achieving them will be clarified with reference to embodiments described below in detail with reference to the drawings. However, embodiments according to the present disclosure are not limited to the following embodiments and may be embodied in various forms.

Hereinafter, embodiments will be described with reference to the accompanying drawings, wherein like reference numerals refer to like elements throughout and a repeated description thereof is omitted.

While such terms as "first" and "second" may be used to describe various elements, such elements must not be limited to the above terms. The above terms are used to distinguish one element from another.

The singular forms "a," "an," and "the" as used herein are intended to include the plural forms as well unless the context clearly indicates otherwise.

It will be understood that the terms "comprise," "comprising," "include" and/or "including" as used herein specify the presence of stated features or elements but do not preclude the addition of one or more other features or elements.

It will be further understood that, when a layer, region, or element is referred to as being "on" another layer, region, or element, it can be directly or indirectly on the other layer, region, or element. That is, for example, intervening layers, regions, or elements may be present.

It will be understood that when a layer, region, or element is referred to as being "connected" to another layer, region, or element, it may be "directly connected" to the other layer, region, or element or may be "indirectly connected" to the other layer, region, or element with other layer, region, or element interposed therebetween. For example, it will be understood that when a layer, region, or element is referred to as being "electrically connected" to another layer, region, or element, it may be "directly electrically connected" to the other layer, region, or element or may be "indirectly electrically connected" to the other layer, region, or element with another layer, region, or element interposed therebetween.

In the present specification, "A and/or B" means A or B, or A and B. In the present specification, "at least one of A and B" means A or B, or A and B.

The x-axis direction, the y-axis direction and the z-axis direction are not limited to three axes of the rectangular coordinate system, and may be interpreted in a broader sense. For example, the x-axis direction, the y-axis direction, and the z-axis direction may be perpendicular to one another, or may represent different orientations that are not perpendicular to one another.

In this specification, "about" or "approximately" includes explicitly stated values and may mean values within an allowable range determined in consideration of errors due to limitations of the measurement system and the like. For example, "about" may mean values within +30%, +20%, +10%, or +5% of the explicitly stated value.

In the case where a certain embodiment may be implemented differently, a specific process order may be performed in the order different from the described order. As an example, two processes successively described may be performed simultaneously (or substantially simultaneously) and performed in the opposite order.

Sizes of elements in the drawings may be exaggerated or reduced for convenience of explanation. As an example, the size and thickness of each element shown in the drawings are arbitrarily represented for convenience of description, and thus, the disclosure is not necessarily limited thereto.

FIG. 1 is a schematic perspective view of a display apparatus 1 according to some embodiments.

Referring to FIG. 1, the display apparatus 1 may include a display area DA and a non-display area NDA outside (e.g., in a periphery, or outside a footprint of) the display area DA. The display apparatus 1 may be configured to display images through an array of a plurality of sub-pixels arranged two-dimensionally in the display area DA. The plurality of sub-pixels include a first sub-pixel, a second sub-pixel, and a third sub-pixel. Hereinafter, for convenience of description, a case where the first sub-pixel is a red sub-pixel Pr, the second sub-pixel is a green sub-pixel Pg, and the third sub-pixel is a blue sub-pixel Pb is described. The plurality of sub-pixels may also include white sub-pixels.

A red sub-pixel Pr, a green sub-pixel Pg, and a blue sub-pixel Pb are regions that are configured to respectively emit red, green, and blue light. The display apparatus 1 may be configured to display images by using light emitted from the sub-pixels.

As shown in FIG. 1, each of the red sub-pixel Pr, the green sub-pixel Pg, and the blue sub-pixel Pb has a quadrangular shape when viewed in a direction (a z axis direction) perpendicular to the upper surface of the display apparatus 1. However, the embodiments according to the present disclosure are not limited thereto. As an example, each of the red sub-pixel Pr, the green sub-pixel Pg, and the blue sub-pixel Pb may have a circular shape or an elliptical shape when viewed in a direction (the z axis direction) perpendicular to the upper surface of the display apparatus 1, or in a plan view.

The non-display area NDA is a region that is configured not to display images and may surround the display area DA entirely. A driver or a main voltage line configured to provide electric signals or power to sub-pixel circuits may be arranged in the non-display area NDA. Pads may be arranged in the non-display area NDA, wherein electronic elements or a printed circuit board may be electrically connected to the pads.

As shown in FIG. 1, the display area DA may have a polygonal shape such as a quadrangular shape. As an example, the display area DA may have a rectangular shape in which a horizontal length thereof is greater than a vertical length, a rectangular shape in which a horizontal length thereof is less than a vertical length, or a square shape. Alternatively, the display area DA may have various shapes such as an elliptical shape or a circular shape.

Figure 2:
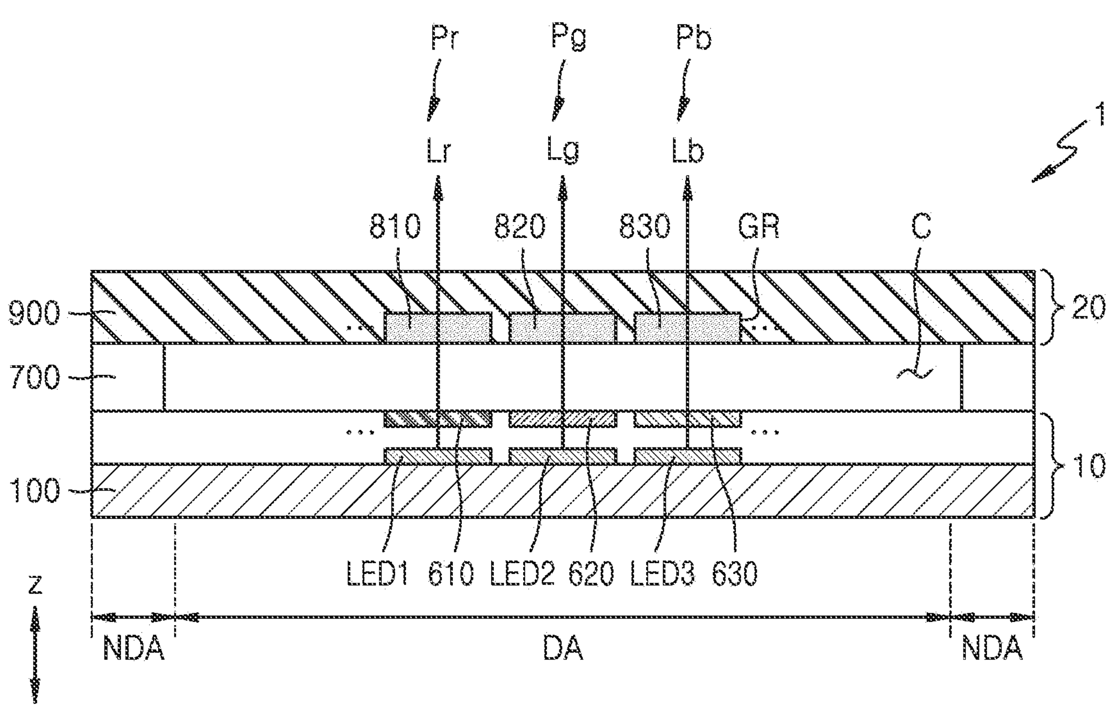
FIG. 2 is a schematic cross-sectional view of a display apparatus according to some embodiments.

FIG. 2 is a schematic cross-sectional view of the display apparatus 1 according to some embodiments.

Referring to FIG. 2, the display apparatus 1 may include the red sub-pixel Pr, the green sub-pixel Pg, and the blue sub-pixel Pb arranged in the display area DA. The blue sub-pixel Pb may be configured to emit light of a wavelength in a first wavelength band, the red sub-pixel Pr may be configured to emit light of a wavelength in a second wavelength band, and the green sub-pixel Pg may be configured to emit light of a wavelength in a third wavelength band. Here, the first wavelength band may be from about 450 nm to about 495 nm, and light of a wavelength in the first wavelength band may be blue light Lb. The second wavelength band may be in a range from 625 nanometers (nm) (or about 625 nm) to 780 nm (or about 780 nm), and light of a wavelength in the second wavelength band may be red light Lr. The third wavelength band may be in a range of 495 nm (or about 495 nm) to 570 nm (or about 570 nm), and light of a wavelength in the third wavelength band may be green light Lg.

According to some embodiments, the display apparatus 1 may include a display panel 10 and an encapsulation panel 20. The display panel 10 may include a first substrate 100 and display elements located over the first substrate 100. The display elements may be, for example, organic light-emitting diodes. According to some embodiments, each of the red sub-pixel Pr, the green sub-pixel Pg, and the blue sub-pixel Pb may include an organic light-emitting diode.

The red sub-pixel Pr may include a first light-emitting diode LED1, the green sub-pixel Pg may include a second light-emitting diode LED2, and the blue sub-pixel Pb may include a third light-emitting diode LED3. According to some embodiments, the first light-emitting diode LED1, the second light-emitting diode LED2, and the third light-emitting diode LED3 may be configured to emit blue light of a wavelength in the first wavelength band.

The red sub-pixel Pr may include a first quantum-dot layer 610 located over the first light-emitting diode LED1. The first quantum-dot layer 610 may be configured to convert blue light Lb to red light Lr, wherein the blue light Lb is emitted from the first light-emitting diode LED1.

The green sub-pixel Pg may include a second quantum-dot layer 620 located over the second light-emitting diode LED2. The second quantum-dot layer 620 may be configured to convert blue light Lb to green light Lg, wherein the blue light Lb is emitted from the second light-emitting diode LED2.

The blue sub-pixel Pb may include a light-transmissive layer 630 located over the third light-emitting diode LED3. The light-transmissive layer 630 may be configured to transmit blue light Lb without color conversion, wherein the blue light Lb is emitted from the third light-emitting diode LED3.

The first quantum-dot layer 610, the second quantum-dot layer 620, and the light-transmissive layer 630 may be located in the display panel 10. Here, 'located in the display panel 10' means that the first quantum-dot layer 610, the second quantum-dot layer 620, and the light-transmissive layer 630 are formed directly on the layers located on the first substrate 100 to implement the display panel 10.

The encapsulation panel 20 may include a second substrate 900 defining grooves GR, and a first organic material layer 810, a second organic material layer 820, and a third organic material layer 830 each filling the grooves GR.

The grooves GR may be defined in a surface (a lower surface) of the second substrate 900 in a direction to the first substrate 100. When viewed in a direction (a z axis direction) perpendicular to the upper surface of the display apparatus 1, the grooves GR may be arranged to respectively overlap the first light-emitting diode LED1, the second light-emitting diode LED2, and the third light-emitting diode LED3. Accordingly, the first organic material layer 810 may overlap the first light-emitting diode LED1, the second organic material layer 820 may overlap the second light-emitting diode LED2, and the third organic material layer 830 may overlap the third light-emitting diode LED3.

The first organic material layer 810, the second organic material layer 820, and the third organic material layer 830 may be located on the encapsulation panel 20. Here, 'located on the encapsulation panel 20' means that the first organic material layer 810, the second organic material layer 820, and the third organic material layer 830 are directly formed on the second substrate 900 to implement the encapsulation panel 20. In other words, the first organic material layer 810, the second organic material layer 820, and the third organic material layer 830 may be directly formed on the second substrate 900 using a method such as inkjet printing, spin coating, and slit coating.

The encapsulation panel 20 may be bonded to the display panel 10 such that the first light-emitting diode LED1, the second light-emitting diode LED2, and the third light-emitting diode LED3 respectively face the first organic material layer 810, the second organic material layer 820, and the third organic material layer 830.

Light emitted from the first light-emitting diode LED1 may pass through the first quantum-dot layer 610 and the first organic material layer 810 and be emitted as red light Lr. Light emitted from the second light-emitting diode LED2 may pass through the second quantum-dot layer 620 and the second organic material layer 820 and be emitted as green light Lg. Light emitted from the third light-emitting diode LED3 may pass through the light-transmissive layer 630 and the third organic material layer 830 and be emitted as blue light Lb.

The display panel 10 and the encapsulation panel 20 may be connected to each other through a sealing member 700. The sealing member 700 may be arranged in the non-display area NDA to surround the display area DA. As an example, the sealing member 700 may have a closed loop shape surrounding the display area DA when viewed in a direction (the z axis direction) perpendicular to the upper surface of the display apparatus 1.

The sealing member 700 and the encapsulation panel 20 may completely block the first light-emitting diode LED1, the second light-emitting diode LED2, the third light-emitting diode LED3, and the like of the display panel 10 from the outside.

A cavity C may be defined between the display panel 10 and the encapsulation panel 20 by the sealing member 700. The first quantum-dot layer 610, the second quantum-dot layer 620, and the light-transmissive layer 630 may be arranged to respectively face the first organic material layer 810, the second organic material layer 820, and the third organic material layer 830 with the cavity C therebetween. The cavity C may be an empty space in which a filler and the like are not located. Hydrogen ions and the like may be supplied from the first organic material layer 810, the second organic material layer 820, and the third organic material layer 830 to the first quantum-dot layer 610, the second quantum-dot layer 620, and the light-transmissive layer 630 through the cavity C.

The sealing member 700 may include sealant, frit, and the like. According to some embodiments, the sealing member 700 may include a light-curable resin cured by an ultraviolet ray and the like.

Figure 3:
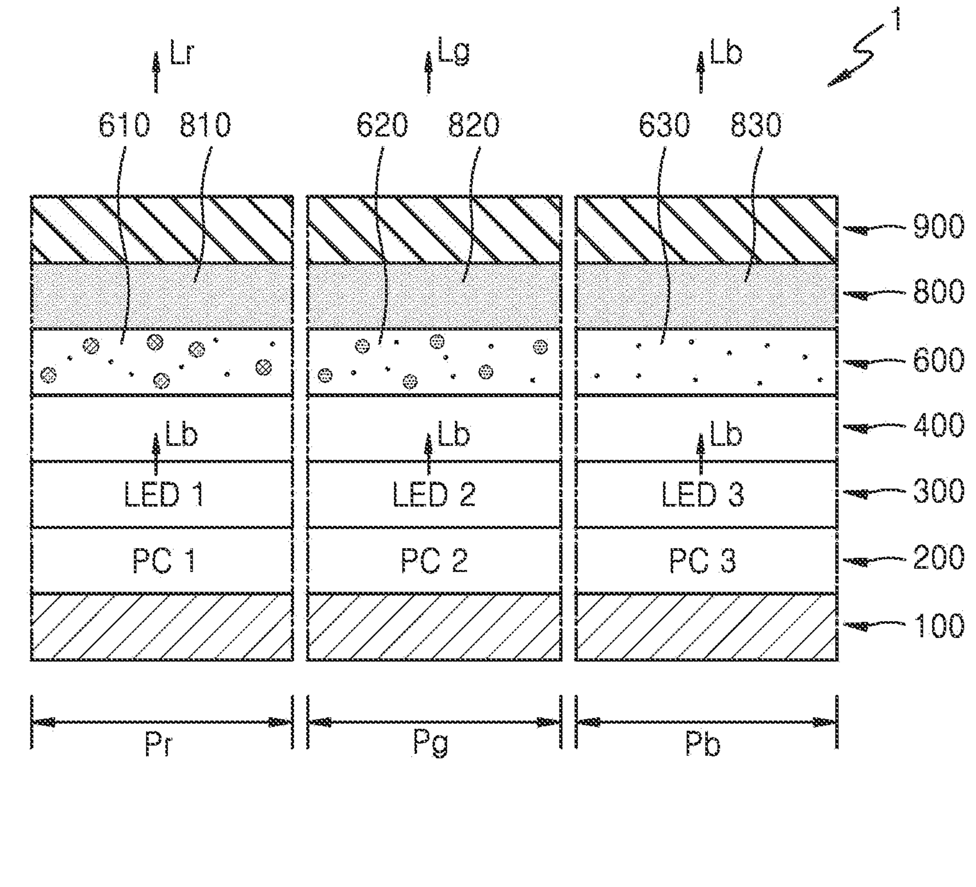
FIG. 3 is a schematic cross-sectional view of respective sub-pixels of the display apparatus according to some embodiments.

FIG. 3 is a schematic cross-sectional view of respective sub-pixels of the display apparatus 1 according to some embodiments.

Referring to FIG. 3, the display apparatus 1 may include a circuit layer 200 on the first substrate 100. The circuit layer 200 may include first to third sub-pixel circuits PC1, PC2, and PC3. The first to third sub-pixel circuits PC1, PC2, and PC3 may be respectively electrically connected to the first to third light-emitting diodes LED1, LED2, and LED3 of a light-emitting diode layer 300.

The first to third light-emitting diodes LED1, LED2, and LED3 may each include an organic light-emitting diode including an organic material. According to some embodiments, the first to third light-emitting diodes LED1, LED2, and LED3 may each include an inorganic light-emitting diode including an inorganic material. The inorganic light-emitting diode may include a PN-junction diode including inorganic semiconductor-based materials. When a forward voltage is applied to a PN-junction diode, holes and electrons are injected and energy created by recombination of the holes and the electrons is converted to light energy, and thus, light of a preset color may be emitted. The inorganic light-emitting diode may have a width of several micrometers to hundreds of micrometers, or several nanometers to hundreds of nanometers.

In some embodiments, the first to third light-emitting diodes LED1, LED2, and LED3 may each be light-emitting diodes including quantum dots. As described above, an emission layer of the first to third light-emitting diodes LED1, LED2, and LED3 may include an organic material, an inorganic material, quantum dots, an organic material and quantum dots, or an inorganic material and quantum dots.

The first to third light-emitting diodes LED1, LED2, and LED3 may be configured to emit light of the same color. As an example, the first light-emitting diode LED1, the second light-emitting diode LED2, and the third light-emitting diode LED3 may be configured to emit light (e.g., blue light Lb) of a wavelength in the first wavelength band, and the blue light Lb emitted from the first light-emitting diode LED1, the second light-emitting diode LED2, and the third light-emitting diode LED3 may pass through a color-converting layer 600 through an encapsulation layer 400 on the light-emitting diode layer 300.

The color-converting layer 600 may include optical portions configured to convert the color of blue light Lb emitted from the light-emitting diode layer 300, or configured to transmit the light without converting the color. As an example, the color-converting layer 600 may include color converters and a transmitter, wherein the color converters convert blue light Lb emitted from the light-emitting diode layer 300 to light of a different color, and the transmitter transmits blue light Lb emitted from the light-emitting diode layer 300 without converting a color thereof. The color-converting layer 600 may include the first quantum-dot layer 610 corresponding to the red sub-pixel Pr, the second quantum-dot layer 620 corresponding to the green sub-pixel Pg, and the light-transmissive layer 630 corresponding to the blue sub-pixel Pb. The first quantum-dot layer 610 may be configured to convert blue light Lb to red light Lr, and the second quantum-dot layer 620 may be configured to convert blue light Lb to green light Lg. The light-transmissive layer 630 may be configured to transmit blue light Lb without converting the blue light Lb.

Blue light Lb emitted from the light-emitting diode layer 300 may be light of a wavelength in the first wavelength band. The first wavelength band may be, for example, from about 450 nm to about 495 nm. Red light Lr converted from blue light Lb by the first quantum-dot layer 610 may be light of a wavelength in the second wavelength band. The second wavelength band may be, for example, from about 625 nm to about 780 nm. Green light Lg converted by the second quantum-dot layer 620 may be light of a wavelength in the third wavelength band. The third wavelength band may be, for example, from about 495 nm to about 570 nm. The embodiments according to the present disclosure are not limited thereto, and the wavelength band to which a wavelength of light emitted from the light-emitting diode layer 300 belongs, and the wavelength band to which a wavelength of light after the conversion belongs, may be modified different.

The circuit layer 200, the light-emitting diode layer 300, the encapsulation layer 400, and the color-converting layer 600 may be sequentially formed on the first substrate 100.

The second substrate 900 may be located over the first substrate 100 such that the circuit layer 200, the light-emitting diode layer 300, the encapsulation layer 400, and the color-converting layer 600 are located therebetween. The second substrate 900 may include glass or a light-transmissive organic material. The second substrate 900 may include a light-transmissive organic material such as an acryl-based resin.

An ion-supplying layer 800 may be located on a surface (a lower surface) of the second substrate 900 in a direction to the first substrate 100. The ion-supplying layer 800 may be located on the color-converting layer 600. The ion-supplying layer 800 may include the first to third organic material layers 810, 820, and 830.

The first to third organic material layers 810, 820, and 830 may be resins containing an acidic substance that releases hydrogen ions through a polymerization reaction when exposed to ultraviolet rays or heat. According to some embodiments, the first to third organic material layers 810, 820, and 830 may include a polymer having a carboxyl group. As an example, the first to third organic material layers 810, 820, and 830 may include polyacrylic acid. According to some embodiments, the first to third organic material layers 810, 820, and 830 may include a light-transmissive organic material not including dye and/or pigment.

The ion-supplying layer 800 may release hydrogen ions, water ($H_2O$), and/or methanol when exposed to ultraviolet rays or heat. Hydrogen ions, water ($H_2O$), and/or methanol released from the ion-supplying layer 800 are transferred to the color-converting layer 600 to positively age the first quantum-dot layer 610 and the second quantum-dot layer 620, thereby relatively improving a light efficiency of the display apparatus 1.

The ion-supplying layer 800 is formed on the second substrate 900, and then the first substrate 100 and the second substrate 900 are bonded to each other such that the ion-supplying layer 800 faces the color-converting layer 600.

The display apparatus 1 having the above structure may include electronic apparatuses that may display moving images or still images such as televisions, advertisement boards, screens for a theater, monitors, tablet personal computers, and the like.

Figure 4:
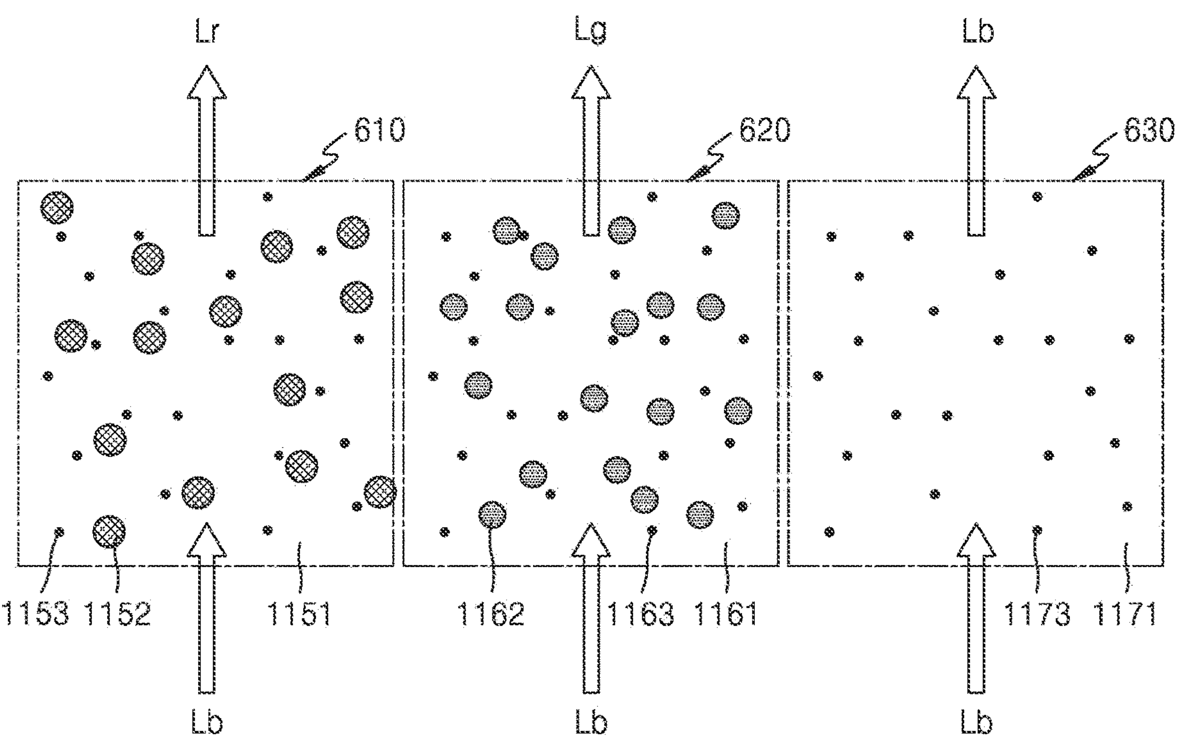
FIG. 4 is a schematic view of a color-converting layer of FIG. 3.

FIG. 4 is a schematic view of the color-converting layer of FIG. 3.

Referring to FIG. 4, the first quantum-dot layer 610 may be configured to convert blue light Lb incident thereto to red light Lr. The first quantum-dot layer 610 may include a first photosensitive polymer 1151, first quantum dots 1152 dispersed in the first photosensitive polymer 1151, and first scattering particles 1153.

The first quantum dots 1152 may be excited by blue light Lb and may isotropically emit red light Lr having a greater wavelength than the wavelength of the blue light Lb. The first photosensitive polymer 1151 may be an organic material having light transmittance. The first scattering particles 1153 may increase a color-converting efficiency by scattering blue light Lb not absorbed in the first quantum dots 1152 and allowing more first quantum dots 1152 to be excited. In addition, the first scattering particles 1153 may scatter light in various directions regardless of an incident angle while substantially not converting the wavelength of incident light. Through this, the first scattering particles 1153 may relatively improve the lateral visibility of the display apparatus. The first scattering particles 1153 may be, for example, titanium oxide ($TiO_2$), metal particles, or the like.

The first quantum-dots 1152 may include a Group II-VI semiconductor compound, a Group III-V semiconductor compound, a Group III-VI semiconductor compound, a Group I-III-VI semiconductor compound, and a Group IV-VI semiconductor compound, or an arbitrary combination thereof.

Examples of Group II-VI semiconductor compounds may include a binary element compound such as CdS, CdSe, CdTe, ZnS, ZnSe, ZnTe, ZnO, HgS, HgSe, HgTe, MgSe or MgS, a ternary element compound such as CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe or MgZnS, a quaternary element compound such as CdZnSeS, CdZnSeTe, CdZnSTe, CdHgSeS, CdHgSeTe, CdHgSTe, HgZnSeS, HgZnSeTe or HgZnSTe, or any combination thereof.

Examples of Group III-V semiconductor compounds may include a binary element compound such as GaN, GaP, GaAs, GaSb, AlN, AlP, AlAs, AlSb, InN, InP, InAs or InSb, a ternary element compound such as GaNP, GaNAs, GaNSb, GaPAs, GaPSb, AlNP, AlNAs, AlNSb, AlPAS, AlPSb, InGaP, InNP, InAlP, InNAs, InNSb, InPAs, InPSb or GaAlNP, a quaternary element compound such as GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, or any combination thereof. The Group III-V semiconductor compound may further include a Group II element. Examples of Group III-V semiconductor compounds that further include Group II elements may include InZnP, InGaZnP or InAlZnP.

Examples of Group III-VI semiconductor compounds may include a binary element compound such as GaS, GaSe, $Ga_2Se_3$, GaTe, InS, $In_2S_3$, InSe, $In_2Se_3$ or InTe, a ternary element compound such as AgInS, $AgInS_2$, CuInS, $CuInS_2$, $InGaS_3$ or InGaSes, or any combination thereof.

Examples of Group I-III-VI semiconductor compounds may include a ternary element compound such as AgInS, $AgInS_2$, CuInS, $CuInS_2$, $CuGaO_2$, $AgGaO_2$ or $AgAlO_2$, or any combination thereof.

Examples of Group IV-VI semiconductor compounds may include a binary element compound such as SnS, SnSe, SnTe, PbS, PbSe or PbTe, a ternary element compound such as SnSeS, SnSeTe, SnSTe, PbSeS, PbSeTe, PbSTe, SnPbS, SnPbSe or SnPbTe, a quaternary element compound such as SnPbSSe, SnPbSeTe or SnPbSTe, or any combination thereof.

A Group IV element or compound may include one of a single-element compound including Si or Ge, or a binary element compound including SiC or SiGe, or an arbitrary combination thereof.

Each element included in a multi-element compound such as a binary element compound, a ternary element compound, and a quaternary element compound may be present in a particle in a uniform concentration or a non-uniform concentration.

A quantum dot may have a single structure in which the concentration of each element included in the relevant quantum dot is uniform, or a double structure of a core-shell.

As an example, a material of the core may be different from a material of the shell. The shell of a quantum dot may serve as a protective layer that prevents a chemical change of the core to maintain a semiconductor characteristic and/or serve as a charging layer for giving an electrophoretic characteristic to the quantum dot. The shell may include a single layer or a multi-layer. An interface between the core and the shell may have a concentration gradient in which the concentration of an element existing in the shell reduces toward the center.

Examples of the shell of the quantum dot include oxide of metal or non-metal, a semiconductor compound, or a combination thereof. Examples of oxides of metals or non-metals may include one of a binary element compound including $SiO_2$, $Al_2O_3$, $TiO_2$, ZnO, MnO, $Mn_2O_3$, $Mn_3O_4$, CuO, FeO, $Fe_2O_3$, $Fe_3O_4$, CoO, $Co_3O_4$, NiO, a ternary element compound including $MgAl_2O_4$, $CoFe_2O_4$, $NiFe_2O_4$, $CoMn_2O_4$, and an arbitrary combination thereof. Examples of the semiconductor compound may include, as described above, a Group II-VI semiconductor compound, a Group III-V semiconductor compound, a Group III-VI semiconductor compound, a Group I-III-VI semiconductor compound, a Group IV-VI semiconductor compound, and an arbitrary combination thereof. As an example, the semiconductor compound may include one of CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, AlSb, and an arbitrary combination thereof.

A quantum dot may have a full width of half maximum (FWHM) of a light emission wavelength spectrum of 45 nm or less, specifically about 40 nm or less, and more specifically about 30 nm or less. Within this range, color purity or color reproduction may be relatively improved. In addition, because light emitted from the quantum dot is emitted in all directions, a viewing angle of light may be relatively improved.

In addition, the shape of the quantum dot may be a spherical shape, a pyramid shape, a multi-arm shape, a cubic shape, a nanoparticle, a nanotube, a nanowire, a nanofiber, a nano plate particle, or the like.

Because an energy band gap may be adjusted by adjusting the size of the quantum dot, light in various wavelength bands may be obtained from a quantum-dot emission layer. Accordingly, a light-emitting element that emits light in various wavelengths may be implemented by using quantum dots of different sizes. Specifically, the size of the quantum dot may be selected such that red, green, and/or blue light is emitted. In addition, the size of the quantum dot may be configured such that light of various colors is combined to emit white light.

The second quantum-dot layer 620 may be configured to convert blue light Lb incident thereto to green light Lg. The second quantum-dot layer 620 may include the second photosensitive polymer 1161, the second quantum dots 1162 dispersed in the second photosensitive polymer 1161, and the second scattering particles 1163.

The second quantum dots 1162 may be excited by blue light Lb and may isotropically emit green light Lg having a greater wavelength than the wavelength of the blue light Lb. The second photosensitive polymer 1161 may be an organic material having light transmittance.

The second scattering particles 1163 may increase a color-converting efficiency by scattering blue light Lb not absorbed in the second quantum dots 1162 and allowing more second quantum dots 1162 to be excited. The second scattering particles 1163 may be, for example, titanium oxide ($TiO_2$), metal particles, or the like. The second quantum-dots 1162 may include a Group II-VI semiconductor compound, a Group III-V semiconductor compound, a Group III-VI semiconductor compound, a Group I-III-VI semiconductor compound, and a Group IV-VI semiconductor compound, or an arbitrary combination thereof.

According to some embodiments, the first quantum dots 1152 may include the same material as that of the second quantum dots 1162. In this case, the size of the first quantum dots 1152 may be greater than the size of the second quantum dots 1162.

The light-transmissive layer 630 may transmit blue light Lb without converting the blue light Lb incident to the light-transmissive layer 630. The light-transmissive layer 630 may include a third photosensitive polymer 1171 in which third scattering particles 1173 are dispersed. The third photosensitive polymer 1171 may include, for example, an organic material having a light transmittance such as a silicon resin, epoxy resin, and the like, and include the same material as the material of the first photosensitive polymer 1151 and the second photosensitive polymer 1161. The third scattering particles 1173 may scatter and emit blue light Lb and include the same material as those of the first and second scattering particles 1153 and 1163.

Figure 5:
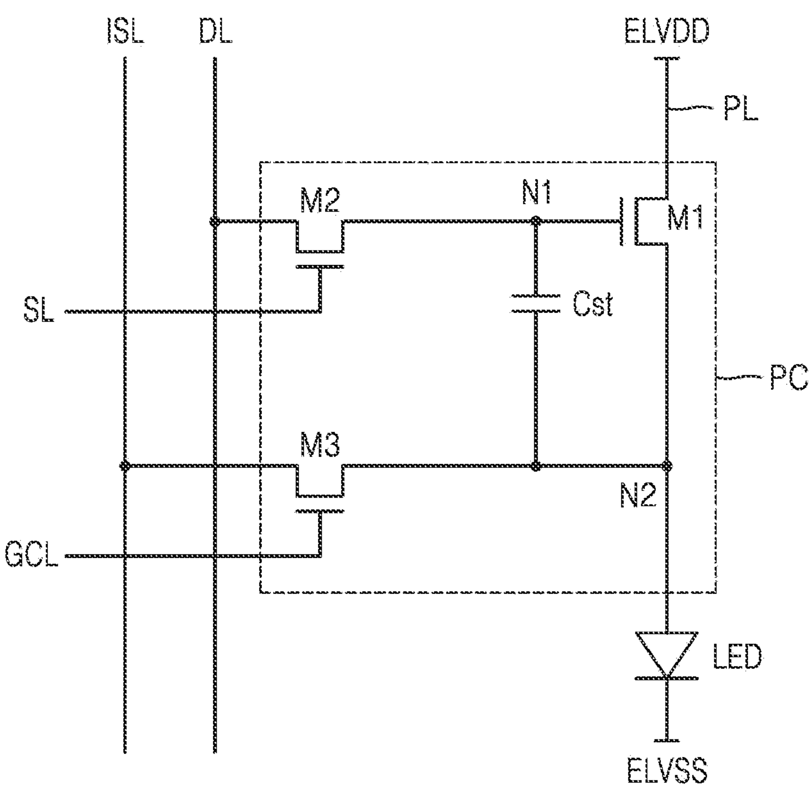
FIG. 5 is a schematic equivalent circuit diagram of a light-emitting diode and a sub-pixel circuit electrically connected to the light-emitting diode of a display apparatus according to some embodiments.

FIG. 5 is a schematic equivalent circuit diagram of a light-emitting diode and a sub-pixel circuit electrically connected to the light-emitting diode of a display apparatus according to some embodiments.

The sub-pixel circuit PC shown in FIG. 5 may correspond to each of the first to third sub-pixel circuits PC1, PC2, and PC3 described with reference to FIG. 3, and the light-emitting diode LED shown in FIG. 5 may correspond to each of the first to third light-emitting diodes LED1, LED2, and LED3 described with reference to FIG. 3.

Referring to FIG. 5, a pixel electrode (e.g., an anode) of the light-emitting diode LED may be connected to the sub-pixel circuit PC, and an opposite electrode (e.g., a cathode) of the light-emitting diode LED may be connected to the main voltage line and configured to receive a common voltage ELVSS. The light-emitting diode LED may be configured to emit light at a brightness corresponding to the amount of current supplied from the sub-pixel circuit PC.

The sub-pixel circuit PC may be configured to control the amount of current flowing through the light-emitting diode LED according to a data signal. The sub-pixel circuit PC may include a first transistor M1, a second transistor M2, a third transistor M3, and a storage capacitor Cst.

Each of the first transistor M1, the second transistor M2, and the third transistor M3 may be an oxide semiconductor transistor including a semiconductor layer that includes an oxide semiconductor, or may be a silicon semiconductor transistor including a semiconductor that includes polycrystalline silicon. A first electrode of a transistor may be one of a source electrode and a drain electrode, and a second electrode of a transistor may be the other of a source electrode and a drain electrode depending on the type of a transistor.

The first electrode of the first transistor M1 may be connected to a driving voltage line PL configured to supply a driving voltage ELVDD, and the second electrode of the first transistor M1 may be connected to the pixel electrode of the light-emitting diode LED. A gate electrode of the first transistor M1 may be connected to a first node N1. The first transistor M1 may be configured to control the amount of current flowing from the driving voltage line PL to the light-emitting diode LED according to a voltage of the first node N1.

The second transistor M2 may be a switching transistor. A first electrode of the second transistor M2 may be connected to a data line DL, and a second electrode of the second transistor M2 may be connected to the first node N1. A gate electrode of the second transistor M2 may be connected to a scan line SL. When a scan signal is supplied through the scan line SL, the second transistor M2 may be turned on to electrically connect the data line DL to the first node N1.

The third transistor M3 may be an initialization transistor and/or a sensing transistor. A first electrode of the third transistor M3 may be connected to a second node N2, and a second electrode of the third transistor M3 may be connected to a sensing line SEL. A gate electrode of the third transistor M3 may be connected to a control line GCL.

The storage capacitor Cst may be connected between the first node N1 and the second node N2. As an example, a first capacitor electrode of the storage capacitor Cst may be connected to the gate electrode of the first transistor M1, and a second capacitor electrode of the storage capacitor Cst may be connected to the second electrode of the first transistor M1.

Although it is shown in FIG. 5 that the first transistor M1, the second transistor M2, and the third transistor M3 are n-channel metal oxide semiconductor (MOS) field-effect transistors (FETs), the embodiments according to the present disclosure are not limited thereto. As an example, at least one of the first transistor M1, the second transistor M2, or the third transistor M3 may be a p-channel metal oxide semiconductor (MOS) field-effect transistors (FETs).

In addition, although FIG. 5 shows three transistors, the embodiments according to the present disclosure are not limited thereto. The sub-pixel circuit PC may include four or more transistors. Additionally, the sub-pixel circuit PC may include additional components or fewer components without departing from the spirit and scope of embodiments according to the present disclosure.

Figure 6A:
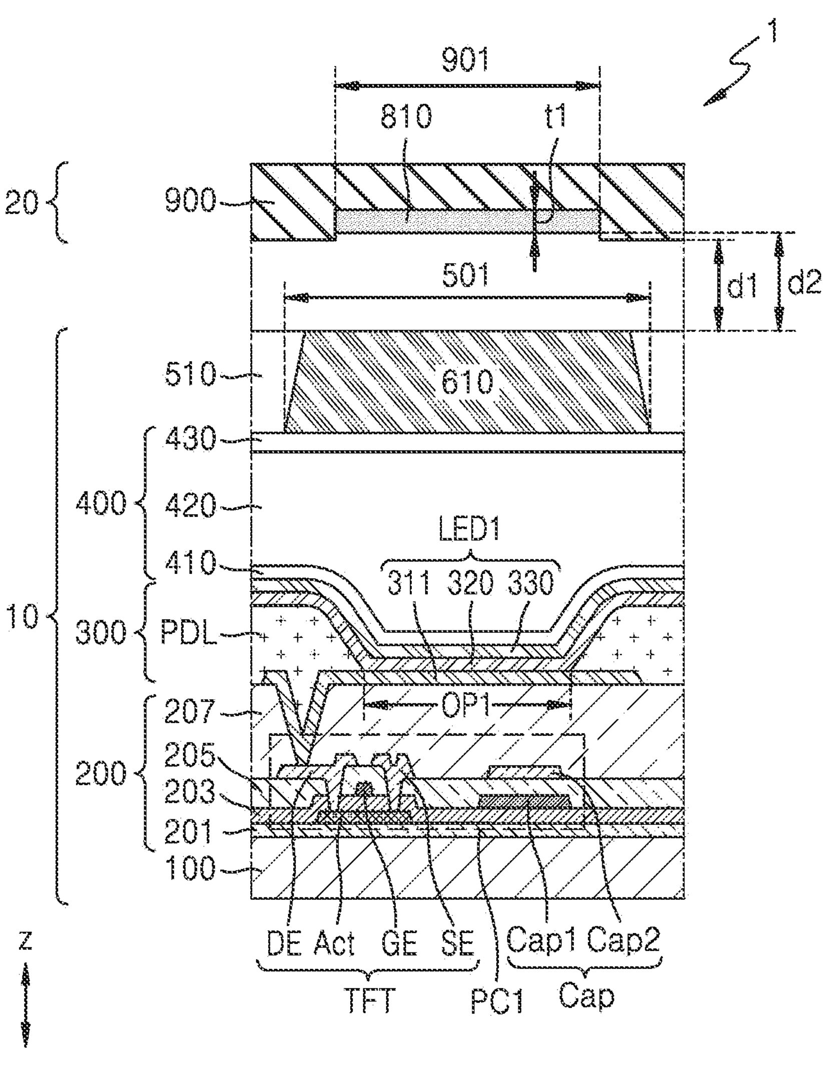
FIG. 6A is a schematic cross-sectional view of a display apparatus according to some embodiments.
Figure 6B:
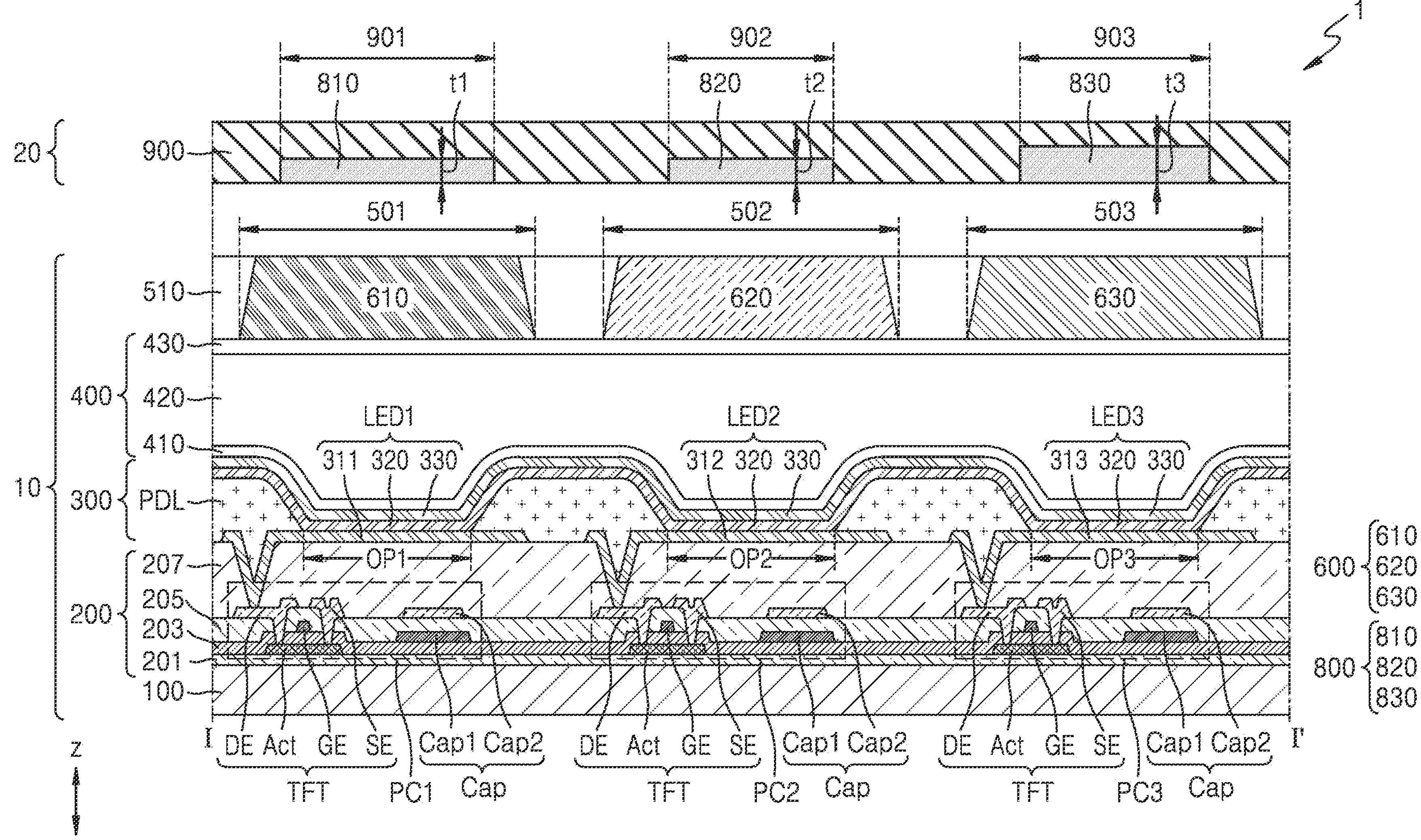
FIG. 6B is a schematic cross-sectional view of a display apparatus according to some embodiments.

FIGS. 6A and 6B are schematic cross-sectional views of a display apparatus according to some embodiments. FIG. 6A is a schematic cross-sectional view of a sub-pixel included in a display apparatus, and FIG. 6B is a schematic cross-sectional view of the display apparatus shown in FIG. 1, taken along the line I-I' of FIG. 1.

Referring to FIG. 6A, the display apparatus 1 may include the display panel 10 and the encapsulation panel 20 located over the display panel 10. The display panel 10 may include the first substrate 100, the circuit layer 200, the light-emitting diode layer 300, the encapsulation layer 400, a bank layer 510, and the first quantum-dot layer 610 sequentially stacked on the first substrate 100.

The first substrate 100 may include glass, metal, or a polymer resin. The first substrate 100 may include a polymer resin such as polyethersulfone, polyacrylate, polyetherimide, polyethylene naphthalate, polyethylene terephthalate, polyphenylene sulfide, polyarylate, polyimide, polycarbonate, or cellulose acetate propionate. The first substrate 100 may have a multi-layered structure including two layers each including the polymer resin, and a barrier layer including an inorganic material (such as silicon oxide, silicon nitride, and silicon oxynitride) therebetween. However, various modifications may be made.

A buffer layer 201 may be located on the first substrate 100. The buffer layer 201 may be configured to prevent impurities from the first substrate 100 from penetrating into a semiconductor layer Act of a thin-film transistor TFT. The buffer layer 201 may include an inorganic insulating material such as silicon oxide, silicon nitride and/or silicon oxynitride.

The circuit layer 200 including the first sub-pixel circuit PC1 may be located on the buffer layer 201. The first sub-pixel circuit PC1 may include the thin-film transistor TFT and a capacitor Cap. The thin-film transistor TFT and the capacitor Cap may respectively correspond to the first transistor M1 and the storage capacitor Cst described with reference to FIG. 5.

The semiconductor layer Act of the thin-film transistor TFT may be located on the buffer layer 201. The semiconductor layer Act may include an oxide semiconductor. The oxide semiconductor may include indium gallium zinc oxide (IGZO), zinc tin oxide (ZTO), indium zinc oxide (IZO), and the like. According to some embodiments, the semiconductor layer Act may include polycrystalline silicon, amorphous silicon, an organic semiconductor, or the like. The semiconductor layer Act may include a channel region and conductive regions, wherein the channel region overlaps a gate electrode GE, and the conductive regions are located on two opposite sides of the channel region and doped or made conductive with impurities. One of the conductive regions may be a source region, and the other may correspond to a drain region.

The gate electrode GE may include various conductive materials and have a single-layered structure or a multi-layered structure. As an example, the gate electrode GE may include a Mo layer and an Al layer. In this case, the gate electrode GE may have a layered structure of Mo/Al/Mo. Alternatively, the gate electrode GE may include a $TiN_x$ layer, an Al layer, and/or a Ti layer.

A source electrode SE and a drain electrode DE may include various conductive materials and have a single-layered structure or a multi-layered structure. As an example, the source electrode SE and the drain electrode DE may include a Ti layer, an Al layer, and/or a Cu layer. The source electrode SE and the drain electrode DE may have a layered structure of Ti/Al/Ti.

Although it is shown in FIG. 6A that the thin-film transistor TFT includes both the source electrode SE and the drain electrode DE, the embodiments according to the present disclosure are not limited thereto. As an example, a conductive region of the semiconductor layer Act of the thin-film transistor TFT may be integrated with a conductive region of a semiconductor layer of another thin-film transistor. In this case, the source electrode SE and/or the drain electrode DE may be omitted. The source electrode SE and/or the drain electrode DE may be a portion of a wiring.

To secure insulation between the semiconductor layer Act and the gate electrode GE, a gate insulating layer 203 may be located between the semiconductor layer Act and the gate electrode GE, wherein the gate insulating layer 203 includes an inorganic material such as silicon oxide, silicon nitride, and/or silicon oxynitride. An interlayer insulating layer 205 may be located on the gate electrode GE, wherein the interlayer insulating layer 205 includes an inorganic material such as silicon oxide, silicon nitride, and/or silicon oxynitride. The source electrode SE and the drain electrode DE may be located on the interlayer insulating layer 205. The insulating layer including the inorganic material may be formed by chemical vapor deposition (CVD) or atomic layer deposition (ALD). This is also applicable to embodiments below and modifications thereof.

The capacitor Cap may include a first capacitor electrode Cap1 and a second capacitor electrode Cap2. The first capacitor electrode Cap1 may be located on the gate insulating layer 203, and the second capacitor electrode Cap2 may be located on the interlayer insulating layer 205.

The first capacitor electrode Cap1 may include various conductive materials and have a single-layered structure or a multi-layered structure. As an example, the first capacitor electrode Cap1 may include a Mo layer and an Al layer. The first capacitor electrode Cap1 may have a layered structure of Mo/Al/Mo. Alternatively, the first capacitor electrode Cap1 may include a $TiN_x$ layer, an Al layer, and/or a Ti layer.

The second capacitor electrode Cap2 may include various conductive materials and have a single-layered structure or a multi-layered structure. As an example, the second capacitor electrode Cap2 may include a Ti layer, an Al layer, and/or a Cu layer. The second capacitor electrode Cap2 may have a layered structure of Mo/Al/Mo.

A planarization layer 207 may be formed on the thin-film transistor TFT and the capacitor Cap. The planarization layer 207 may provide an approximately flat upper surface on a first pixel electrode 311 of the first light-emitting diode LED1. The planarization layer 207 may include an organic insulating material such as acryl, benzocyclobutene (BCB), polyimide, or hexamethyldisiloxane (HMDSO). Although it is shown in FIG. 6A that the planarization layer 207 is a single layer, the planarization layer 207 may be a multi-layer. However, various modifications may be made.

The first light-emitting diode LED1 may be located on the planarization layer 207, wherein the first light-emitting diode LED1 includes the first pixel electrode 311, an opposite electrode 330, and an intermediate layer 320 located between the first pixel electrode 311 and the opposite electrode 330 and including an emission layer. As shown in FIG. 5, the first pixel electrode 311 may be electrically connected to the first sub-pixel circuit PC1 by being in contact with one of the source electrode SE and the drain electrode DE of the thin-film transistor TFT through a contact hole formed in the planarization layer 207.

The first pixel electrode 311 may include a light-transmissive conductive layer and a reflective layer, wherein the light-transmissive conductive layer includes a light-transmissive conductive oxide such as indium tin oxide (ITO), indium oxide ($In_2O_3$), or indium zinc oxide (IZO), and the reflective layer includes metal such as aluminum (Al) or silver (Ag). As an example, the first pixel electrode 311 may have a three-layered structure of ITO/Ag/ITO.

The intermediate layer 320 including the emission layer may have a shape integrated over the plurality of pixels. The intermediate layer 320 may be arranged in the entire surface of the display area DA. When needed, the intermediate layer 320 may be patterned and located on the first pixel electrode 311 of the first light-emitting diode LED1. In addition to the emission layer, the intermediate layer 320 may include a hole injection layer, a hole transport layer, and/or an electron transport layer when needed. The layers included in the intermediate layer 320 may have a shape integrated over the plurality of pixels. Some of layers of the intermediate layer 320, for example, the emission layer may be patterned and arranged to correspond to the first pixel electrode 311 when needed. The emission layer of the intermediate layer 320 may be configured to emit light of a wavelength in the first wavelength band. The first wavelength band may be, for example, from about 450 nm to about 495 nm, and light emitted from the first light-emitting diode LED1 may be blue light Lb.

The intermediate layer 320 may include a plurality of emission layers instead of one emission layer. As an example, the intermediate layer 320 may have a structure in which a first emission layer and a second emission layer are stacked and a charge generation layer and the like are located between the first emission layer and the second emission layer. In this case, a hole transport layer or an electron transport layer may be located between the first emission layer and the charge generation layer and between the second emission layer and the charge generation layer.

The opposite electrode 330 on the intermediate layer 320 may have a shape integrated over the plurality of pixel electrodes. The opposite electrode 330 may be arranged over the entire surface of the display area DA. The opposite electrode 330 may include a light-transmissive conductive layer including ITO, $In_2O_3$, or IZO, and include a semi-transmissive layer including metal such as aluminum (Al), lithium (Li), magnesium (Mg), ytterbium (Yb), or silver (Ag). As an example, the opposite electrode 330 may be a semi-transmissive layer including MgAg, AgYb, Yb/MgAg, or Li/MgAg. A pixel-defining layer PDL may be located on the planarization layer 207.

The pixel-defining layer PDL may cover the edges of the first pixel electrode 311 and define a first pixel opening OP1 exposing the central portion of the first pixel electrode 311. The pixel-defining layer PDL may prevent arcs and the like from occurring at the edges of the first electrodes 311 by increasing a distance between the edges of the first electrode 311 and the opposite electrode 330. The pixel-defining layer PDL may include an organic material such as polyimide or HMDSO.

The first light-emitting diode LED1 including the first pixel electrode 311, the intermediate layer 320 including the emission layer, and the opposite electrode 330 may be deteriorated by moisture, oxygen, and the like. Accordingly, to protect the first light-emitting diode LED1 from external moisture or oxygen, the display apparatus may include the encapsulation layer 400 covering the first light-emitting diode LED1.

The encapsulation layer 400 may include at least one inorganic encapsulation layer and at least one organic encapsulation layer. As an example, the encapsulation layer 400 may include a first inorganic encapsulation layer 410, a second inorganic encapsulation layer 430, and an organic encapsulation layer 420 therebetween.

The first inorganic encapsulation layer 410 and the second inorganic encapsulation layer 430 may include at least one inorganic insulating material such as silicon oxide, silicon nitride, silicon oxy nitride, aluminum oxide, titanium oxide, tantalum oxide, hafnium oxide, and zinc oxide and may be formed using chemical vapor deposition (CVD) and the like. The organic encapsulation layer 420 may include a polymer-based material. The polymer-based material may include an acryl-based resin (e.g., polymethyl methacrylate, poly-acrylic acid, and the like), an epoxy-based resin, polyimide, and polyethylene.

Because the first inorganic encapsulation layer 410 formed by chemical vapor deposition has an approximately uniform thickness, the upper surface thereof is not flat. However, the organic encapsulation layer 420 has an approximately flat upper surface, and thus, the second inorganic encapsulation layer 430 on the organic encapsulation layer 420 may also have an approximately flat upper surface.

The bank layer 510 may be located on the encapsulation layer 400, wherein the bank layer 510 defines a first bank opening 501. The first bank opening 501 of the bank layer 510 may correspond to the first light-emitting diode LED1. That is, when viewed in a direction (the z axis direction) perpendicular to the first substrate 100, the first bank opening 501 of the bank layer 510 may overlap the first pixel opening OP1 of the pixel-defining layer PDL exposing the first pixel electrode 311.

According to some embodiments, the area of the first bank opening 501 of the bank layer 510 may be greater than the area of the first pixel opening OP1 of the pixel-defining layer PDL. Through this, light emitted from the first pixel opening OP1 of the pixel-defining layer PDL may be sufficiently incident into the first bank opening 501 of the bank layer 510.

The bank layer 510 may include various materials, for example, acryl, benzocyclobutene (BCB), or hexamethyldisiloxane (HMDSO). When needed, the bank layer 510 may include a photoresist material. Through this, the bank layer 510 may be easily formed by processes such as exposure and developing processes. Because the bank layer 510 is formed over the first substrate 100 through exposure and developing processes and the like, the bank layer 510 may appear to have an inverse-tapered shape with respect to the first substrate 100. That is, the area of a surface of the bank layer 510 in the direction of the first substrate 100 may be less than the area of a surface of the bank layer 510 in the direction of the second substrate 900.

Light of a wavelength in the first wavelength band generated from the first light-emitting diode LED1 may be converted to light of a wavelength in the second wavelength band by the first quantum-dot layer 610 located in the first bank opening 501 and emitted to the outside. The first quantum-dot layer 610 may overlap the first pixel electrode 311 when viewed in the direction (the z axis direction) perpendicular to the first substrate 100. The first quantum-dot layer 610 may include a photosensitive polymer having a light transmittance, quantum dots, and scattering particles.

As described with reference to FIG. 4, the quantum dots of the first quantum-dot layer 610 may include one of a Group III-VI semiconductor compound, a Group II-VI semiconductor compound, a Group III-V semiconductor compound, a Group III-VI semiconductor compound, a Group I-III-VI semiconductor compound, and a Group IV-VI semiconductor compound, and an arbitrary combination thereof. A diameter of the quantum dots may be, for example, about 1 μm to about 10 μm.

The first quantum-dot layer 610 may be configured to convert light of a wavelength in the first wavelength band emitted from the first light-emitting diode LED1 into light of a wavelength in the second wavelength band. According to some embodiments, a light-transmissive layer may be located in the first bank opening 501. The light-transmissive layer may be configured to transmit light emitted from the first light-emitting diode LED1 without conversion.

The encapsulation panel 20 may be located over the display panel 10 to be located between the circuit layer 200, the light-emitting diode layer 300, and the encapsulation layer 400. As described with reference to FIG. 2, the display panel 10 may be attached to the encapsulation panel 20 using the sealing member 700 outside the display area.

The encapsulation panel 20 may include the second substrate 900 and the first organic material layer 810 (an ion-supplying layer) located on a surface (a lower surface) of the second substrate 900 in the direction of the first substrate 100.

The second substrate 900 may include glass or a light-transmissive organic material. The second substrate 900 may define a first groove 901 in a surface thereof (a lower surface) in the direction of the first substrate 100, wherein the first groove 901 corresponds to the first light-emitting diode LED1. That is, when viewed in a direction (the z axis direction) perpendicular to the first substrate 100, the first groove 901 may be defined to overlap the first pixel opening OP1 and the first bank opening 501. The surface (the lower surface) of the second substrate 900 in the direction of the first substrate 100 and the uppermost surface of the display panel 10, that is, the surface (the upper surface) of the first quantum-dot layer 610 in the direction of the second substrate 900 may be spaced apart from each other by a first distance d1 in a thickness direction.

The first organic material layer 810 may be located in the first groove 901 to fill the first groove 901. A thickness t1 of the first organic material layer 810 may be less than or equal to the depth of the first groove 901. Accordingly, the first distance d1 between a surface (a lower surface) of the second substrate 900 in the direction of the first substrate 100 and a surface (an upper surface) of the first quantum-dot layer 610 in the direction of the second substrate 900 may be equal to or less than a second distance between a surface (a lower surface) of the first organic material layer 810 in the direction of the first substrate 100 and the surface (the upper surface) of the first quantum-dot layer 610 in the direction of the second substrate 900. An empty space may be located between the first quantum-dot layer 610 and the first organic material layer 810, wherein a filler and the like are not located in the empty space. That is, the first quantum-dot layer 610 and the first organic material layer 810 may be arranged to face to each other with the cavity defined by the sealing member therebetween.

The first organic material layer 810 may include resins containing an acidic substance that releases hydrogen ions through a polymerization reaction when exposed to ultraviolet rays or heat. The first organic material layer 810 may include a polymer having a carboxyl group. The first organic material layer 810 may include polyacrylic acid.

The first organic material layer 810 may decompose and release additional water through heat treatment in addition to the water it contains. The first organic material layer 810 may relatively improve the light efficiency of the display apparatus 1 by supplying hydrogen ions, water ($H_2O$), and/or methanol to the first quantum-dot layer 610.

Referring to FIG. 6B, the display apparatus 1 may include the plurality of pixels configured to emit light of different colors. The display apparatus 1 may include the display panel 10 and the encapsulation panel 20 located over the display panel 10. The display panel 10 may include the first to third light-emitting diodes LED1, LED2, and LED3, and the first to third sub-pixel circuits PC1, PC2, and PC3 respectively electrically connected to the first to third light-emitting diodes LED1, LED2, and LED3.

The circuit layer 200 including the first to third sub-pixel circuits PC1, PC2, and PC3 may be located on the first substrate 100, the light-emitting diode layer 300 including the first to third light-emitting diodes LED1, LED2, and LED3 may be located on the circuit layer 200, and the light-emitting diode layer 300 may be sealed by the encapsulation layer 400.

The circuit layer 200 including the first sub-pixel circuit PC1 may be located on the buffer layer 201. Each of the first to third sub-pixel circuits PC1, PC2, and PC3 may include the thin-film transistor TFT and the capacitor Cap.

The planarization layer 207 may be formed on the thin-film transistor TFT and the capacitor Cap. Because the planarization layer 207 has an approximately flat upper surface, first to third pixel electrodes 311, 312, and 313 may be located on the flat surface.

The first to third light-emitting diodes LED1, LED2, and LED3 may be located on the planarization layer 207. The first light-emitting diode LED1 may include the first pixel electrode 311, the intermediate layer 320, and the opposite electrode 330. The first pixel electrode 311 may be electrically connected to the first sub-pixel circuit PC1 through a contact hole formed in the planarization layer 207 and the like.

The second light-emitting diode LED2 may include the second pixel electrode 312, the intermediate layer 320, and the opposite electrode 330. The second pixel electrode 312 may be electrically connected to the second sub-pixel circuit PC2 through a contact hole formed in the planarization layer 207 and the like.

The third light-emitting diode LED3 may include the third pixel electrode 313, the intermediate layer 320, and the opposite electrode 330. The third pixel electrode 313 may be electrically connected to the third sub-pixel circuit PC3 through a contact hole formed in the planarization layer 207 and the like.

The first pixel electrode 311, the second pixel electrode 312, and the third pixel electrode 313 may include a light-transmissive conductive layer and a reflective layer, wherein the light-transmissive conductive layer includes a light-transmissive conductive oxide such as indium tin oxide (ITO), indium oxide ($In_2O_3$) or indium zinc oxide (IZO), and the reflective layer includes metal such as Al or Ag. As an example, the first pixel electrode 311, the second pixel electrode 312, and the third pixel electrode 313 may have a three-layered structure of ITO/Ag/ITO.

The intermediate layer 320 including the emission layer may have a shape integrated over the first pixel electrode 311, the second pixel electrode 312, and the third pixel electrode 313. In addition to the emission layer, the intermediate layer 320 may include a hole injection layer, a hole transport layer, and/or an electron transport layer when needed. The layers included in the intermediate layer 320 may have a shape integrated over the first pixel electrode 311, the second pixel electrode 312, and the third pixel electrode 313. When needed, some of the layers included in the intermediate layer 320 may be patterned and arranged to correspond to the first pixel electrode 311, the second pixel electrode 312, and the third pixel electrode 313. The emission layer of the intermediate layer 320 may be configured to emit light of a wavelength in the first wavelength band.

The opposite electrode 330 may have a shape integrated over the first pixel electrode 311 to third pixel electrode 313. The opposite electrode 330 may include a light-transmissive conductive layer including ITO, $In_2O_3$, or IZO, or include a semi-transmissive layer including metal such as aluminum (Al), lithium (Li), magnesium (Mg), ytterbium (Yb), or silver (Ag). As an example, the opposite electrode 330 may be a semi-transmissive layer including MgAg, AgYb, Yb/MgAg, or Li/MgAg.

The pixel-defining layer PDL may be located on the planarization layer 207. The pixel-defining layer PDL may include pixel openings respectively corresponding to the first to third pixel electrodes 311, 312, and 313. That is, the pixel-defining layer PDL covers the edges of each of the first pixel electrode 311, the second pixel electrode 312, and the third pixel electrode 313, and includes the first pixel opening OP1 that exposes the central portion of the first pixel electrode 311, a second pixel opening OP2 that exposes the central portion of the second pixel electrode 312, and a third pixel opening OP3 that exposes the central portion of the third pixel electrode 313. The pixel-defining layer PDL may include, for example, an organic material such as polyimide or HMDSO.

The encapsulation layer 400 may include at least one inorganic encapsulation layer and at least one organic encapsulation layer. As an example, the encapsulation layer 400 may include the first inorganic encapsulation layer 410, the second inorganic encapsulation layer 430, and the organic encapsulation layer 420 therebetween.

The bank layer 510 including first to third bank openings 501, 502, and 503 may be located on the encapsulation layer 400. The first to third bank openings 501, 502, and 503 of the bank layer 510 may respectively correspond to the first to third light-emitting diodes LED1, LED2, and LED3. Specifically, the first bank opening 501 of the bank layer 510 may correspond to the first pixel opening OP1 of the pixel-defining layer PDL exposing the first pixel electrode 311, the second bank opening 502 may correspond to the second pixel opening OP2 of the pixel-defining layer PDL exposing the second pixel electrode 312, and the third bank opening 503 may correspond to the third pixel opening OP3 of the pixel-defining layer PDL exposing the third pixel electrode 313.

That is, when viewed in a direction (the z axis direction) perpendicular to the first substrate 100, the first bank opening 501 of the bank layer 510 may overlap the first pixel opening OP1 of the pixel-defining layer PDL exposing the first pixel electrode 311, the second bank opening 502 may overlap the second pixel opening OP2 of the pixel-defining layer PDL exposing the second pixel electrode 312, and the third bank opening 503 may overlap the third pixel opening OP3 of the pixel-defining layer PDL exposing the third pixel electrode 313. Alternatively, the first bank opening 501 of the bank layer 510 may overlap the first pixel electrode 311, the second bank opening 502 of the bank layer 510 may overlap the second pixel electrode 312, and the third bank opening 503 of the bank layer 510 may overlap the third pixel electrode 313.

According to some embodiments, the area of the first bank opening 501 of the bank layer 510 may be greater than the area of the first pixel opening OP1 of the pixel-defining layer PDL, the area of the second bank opening 502 may be greater than the area of the second pixel opening OP2, and the area of the third bank opening 503 may be greater than the area of the third pixel opening OP3. Through this, light generated from the first pixel opening OP1 of the pixel-defining layer PDL may be sufficiently incident into the first bank opening 501 of the bank layer 510, light generated from the second pixel opening OP2 of the pixel-defining layer PDL may be sufficiently incident into the second bank opening 502 of the bank layer 510, and light generated from the third pixel opening OP3 of the pixel-defining layer PDL may be sufficiently incident into the third bank opening 503 of the bank layer 510.

Light of a wavelength in the first wavelength band generated from the first light-emitting diode LED1 may be converted to light of a wavelength in the second wavelength band by the first quantum-dot layer 610 located in the first bank opening 501 and emitted to the outside. The first quantum-dot layer 610 may overlap the first pixel electrode 311 when viewed in the direction (the z axis direction) perpendicular to the first substrate 100. The first quantum-dot layer 610 may include a photosensitive polymer having a light transmittance, quantum dots, and scattering particles.

Light of a wavelength in the first wavelength band generated from the second light-emitting diode LED2 may be converted to light of a wavelength in the third wavelength band by the second quantum-dot layer 620 located in the second bank opening 502 and emitted to the outside. The second quantum-dot layer 620 may overlap the second pixel electrode 312 when viewed in the direction (the z axis direction) perpendicular to the first substrate 100. The second quantum-dot layer 620 may include a photosensitive polymer having a light transmittance, quantum dots, and scattering particles.

Each of the first quantum-dot layer 610 and the second quantum-dot layer 620 may include one of a Group III-VI semiconductor compound, a Group II-VI semiconductor compound, a Group III-V semiconductor compound, a Group III-VI semiconductor compound, a Group I-III-VI semiconductor compound, and a Group IV-VI semiconductor compound, and an arbitrary combination thereof.

Light of a wavelength in the first wavelength band generated from the third light-emitting diode LED3 may be emitted to the outside without conversion. According to some embodiments, the light-transmissive layer 630 may be located in the third bank opening 503 of the bank layer 510 overlapping the third pixel electrode 313. The light-transmissive layer 630 may overlap the third pixel electrode 313 when viewed in the direction (the z axis direction) perpendicular to the first substrate 100. The light-transmissive layer 630 may include a photosensitive polymer having a light transmittance and scattering particles.

The encapsulation panel 20 may be located over the display panel 10 to locate the circuit layer 200, the light-emitting diode layer 300, and the encapsulation layer 400 between the encapsulation panel 20 and the first substrate 100. As described with reference to FIG. 2, the display panel 10 may be attached to the encapsulation panel 20 using the sealing member 700 outside the display area.

The encapsulation panel 20 may include the second substrate 900 and the ion-supplying layer 800 located on a surface (a lower surface) of the second substrate 900 in the direction of the first substrate 100. The ion-supplying layer 800 may include the first to third organic material layers 810, 820, and 830.

The second substrate 900 may include glass or a light-transmissive organic material. The second substrate 900 may define first to third grooves 901, 902, and 903 in the surface (the lower surface) of the first substrate 100. The first groove 901 may correspond to the first light-emitting diode LED1, the second groove 902 may correspond to the second light-emitting diode LED2, and the third groove 903 may correspond to the first light-emitting diode LED3. When viewed in the direction (the z axis direction) perpendicular to the first substrate 100, the first groove 901 may overlap the first pixel opening OP1 and the first bank opening 501, the first groove 901 may overlap the first pixel opening OP1 and the first bank opening 501, the second groove 902 may overlap the second pixel opening OP2 and the second bank opening 502, and the third groove 903 may overlap the third pixel opening OP3 and the third bank opening 503. The surface (the lower surface) of the second substrate 900 in the direction of the first substrate 100 and the uppermost surface of the display panel 10, that is, the surface (the upper surface) of the color-converting layer 600 in the direction of the second substrate 900 may be spaced apart from each other in a thickness direction.

The depth of the first groove 901, the depth of the second groove 902, and the depth of the third groove 903 may be equal to or different from one another. According to some embodiments, the depth of the third groove 903 may be different from the depth of the first groove 901 and the depth of the second groove 902. According to some embodiments, the depth of the third groove 903 may be greater than the depth of the first groove 901 and the depth of the second groove 902. According to some embodiments, the depth of the first groove 901 and the depth of the second groove 902 may be equal to each other.

The first organic material layer 810 may be located in the first groove 901 to fill the first groove 901. The thickness t1 of the first organic material layer 810 may be less than or equal to the depth of the first groove 901. The second organic material layer 820 may be located in the second groove 902 to fill the second groove 902. A thickness t2 of the second organic material layer 820 may be less than or equal to the depth of the second groove 902. The third organic material layer 830 may be located in the third groove 903 to fill the third groove 903. A thickness t3 of the third organic material layer 830 may be less than or equal to the depth of the third groove 903.

The thickness t1 of the first organic material layer 810, the thickness t2 of the second organic material layer 820, and the thickness t3 of the third organic material layer 830 may be equal to or different from one another. According to some embodiments, the thickness t3 of the third organic material layer 830 may be different from the thickness t1 of the first organic material layer 810 and the thickness t2 of the second organic material layer 820. According to some embodiments, the thickness t3 of the third organic material layer 830 may be greater than the thickness t1 of the first organic material layer 810 and the thickness t2 of the second organic material layer 820. According to some embodiments, the thickness t1 of the first organic material layer 810 and the thickness t2 of the second organic material layer 820 may be equal (or substantially equal) to each other. According to some embodiments, each of the thickness t1 of the first organic material layer 810 and the thickness t2 of the second organic material layer 820 may be about 600 nm to about 1000 nm, and the thickness t3 of the third organic material layer 830 may be about 1000 nm to about 1400 nm. According to some embodiments, each of the thickness t1 of the first organic material layer 810 and the thickness t2 of the second organic material layer 820 may be about 750 nm, and the thickness t3 of the third organic material layer 830 may be about 1400 nm. Because the thicknesses of the organic material layers of respective pixels configured to emit light of different colors are formed different, light efficiencies of the respective pixels may be relatively improved.

A distance between a surface (a lower surface) of each of the first organic material layer 810, the second organic material layer 820, and the third organic material layer 830 in the direction of the first substrate 100 and a surface (an upper surface) of each of the first quantum-dot layer 610, the second quantum-dot layer 620, and the light-transmissive layer 630 in the direction of the second substrate 900 may be greater than a distance between a surface (a lower surface) of the second substrate 900 in the direction of the first substrate 100 and a surface (an upper surface) of the first quantum-dot layer 610 in the direction of the second substrate 900. That is, a surface (a lower surface) of the ion-supplying layer 800 in the direction of the first substrate 100 and a surface (an upper surface) of the color-converting layer 600 in the direction of the circuit layer 200 may be spaced apart from each other and may not be in contact with each other. An empty space in which a filler and the like are not located may be located between the first quantum-dot layer 610 and the first organic material layer 810, between the second quantum-dot layer 620 and the second organic material layer 820, and between the light-transmissive layer 630 and the third organic material layer 830. That is, the color-converting layer 600 and the ion-supplying layer 800 may be arranged to face each other with the cavity defined by the sealing member therebetween.

The ion-supplying layer 800 may include resins containing an acidic substance that releases hydrogen ions through a polymerization reaction when exposed to ultraviolet rays or heat. The ion-supplying layer 800 may include a polymer having a carboxyl group. According to some embodiments, the ion-supplying layer 800 may include polyacrylic acid.

Figure 7A:
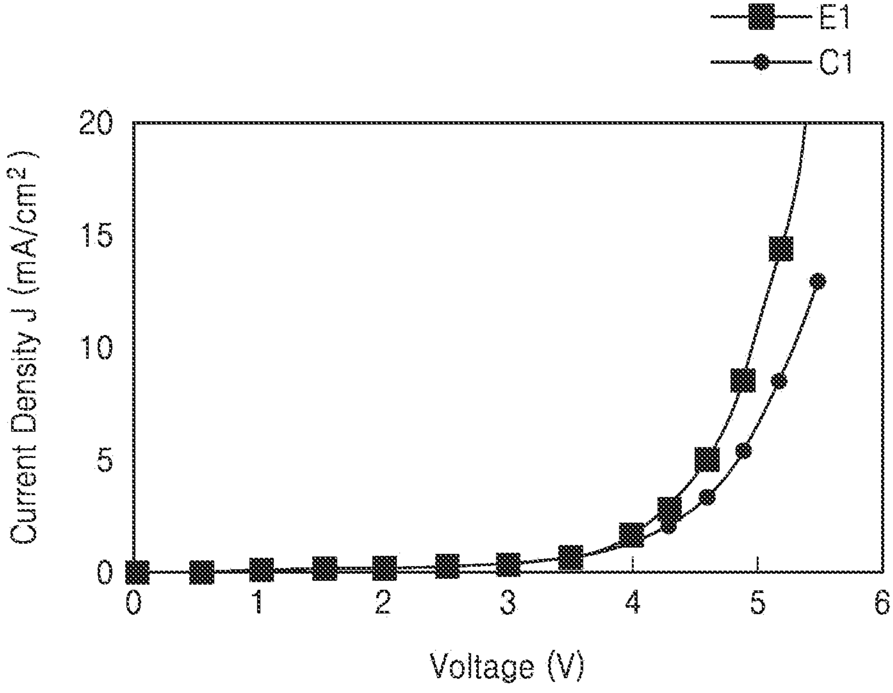
FIG. 7A is a voltage-current density graph of a display apparatus according to some embodiments and a display apparatus according to a comparative example.
Figure 7B:
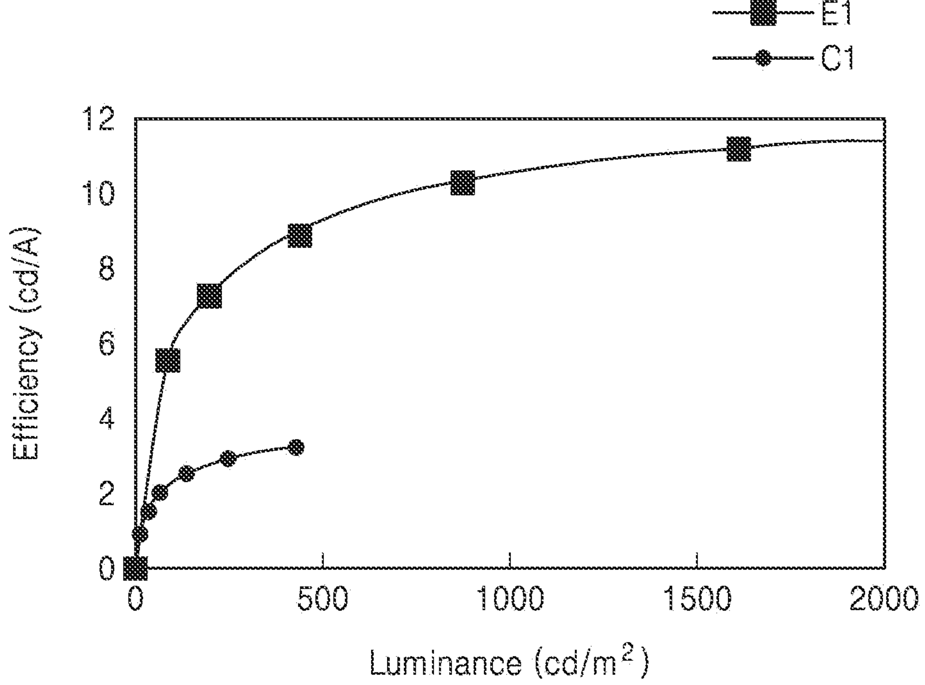
FIG. 7B is a brightness-power efficiency graph of a display apparatus according to some embodiments and a display apparatus according to a comparative example.

FIG. 7A is a voltage-current density graph of a display apparatus according to some embodiments and a display apparatus according to a comparative example, and FIG. 7B is a brightness-power efficiency graph of a display apparatus according to some embodiments and a display apparatus according to a comparative example.

In comparative example C1, a display apparatus was manufactured in which an ion-supplying layer was coated without forming a groove in a second substrate, and the ion-supplying layer was in direct contact with the uppermost surface of a display panel, for example, the upper surface of a color-converting layer. In contrast, in embodiments E1, like the embodiments, a display apparatus was manufactured in which a groove was formed in a second substrate, an ion-supplying layer was located in the groove, and the ion-supplying layer was spaced apart from a color-converting layer in a thickness direction.

Referring to FIG. 7A, it is known that, to reach the same current density, embodiments E1 requires a less voltage than comparative example C1.

Referring to FIG. 7B, it is known that, under the same current density condition, the brightness and power efficiency of embodiments E1 is significantly superior to the brightness and power efficiency of comparative example C1.

Figure 8A:
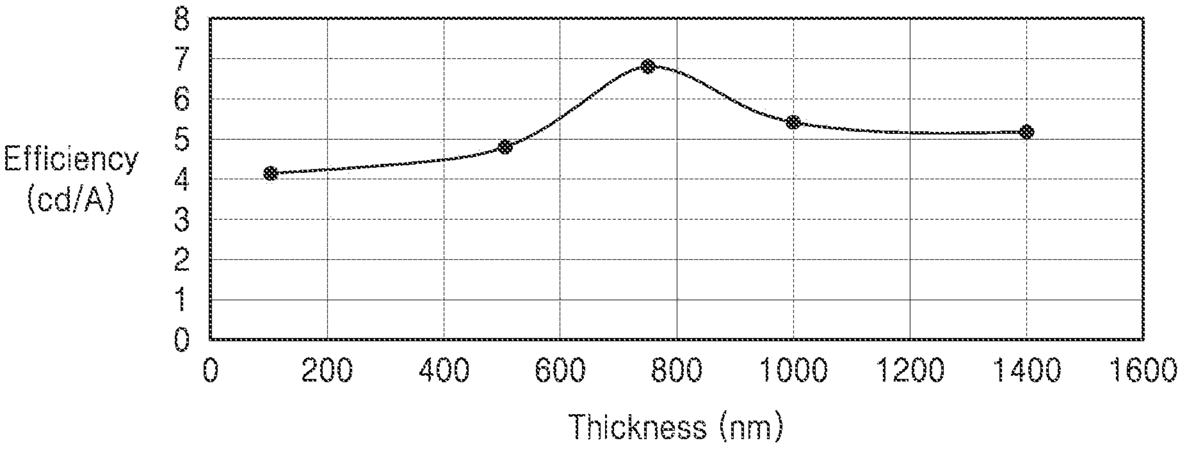
FIGS. 8A, 8B, and 8C are power efficiency graphs according to a thickness of an organic material layer for each sub-pixel according to some embodiments.
Figure 8B:
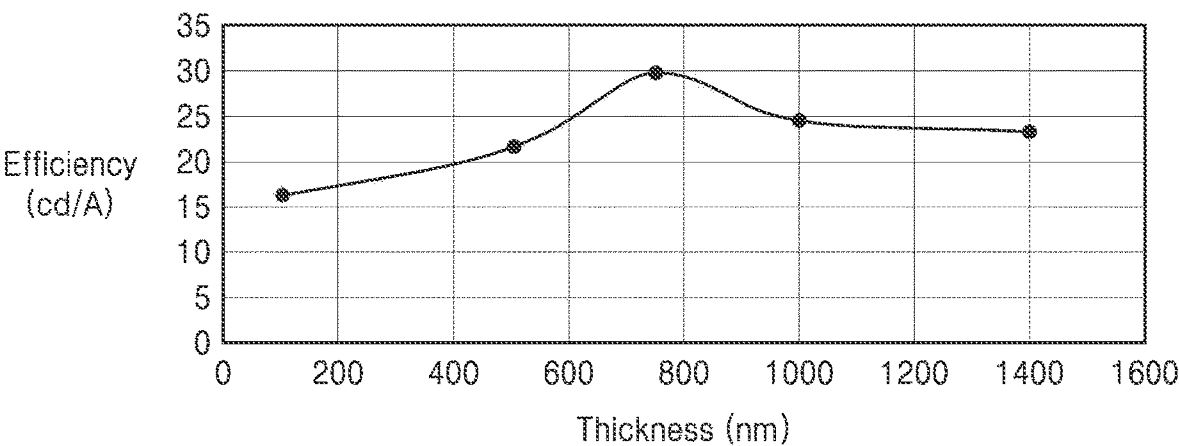
Figure 8C:
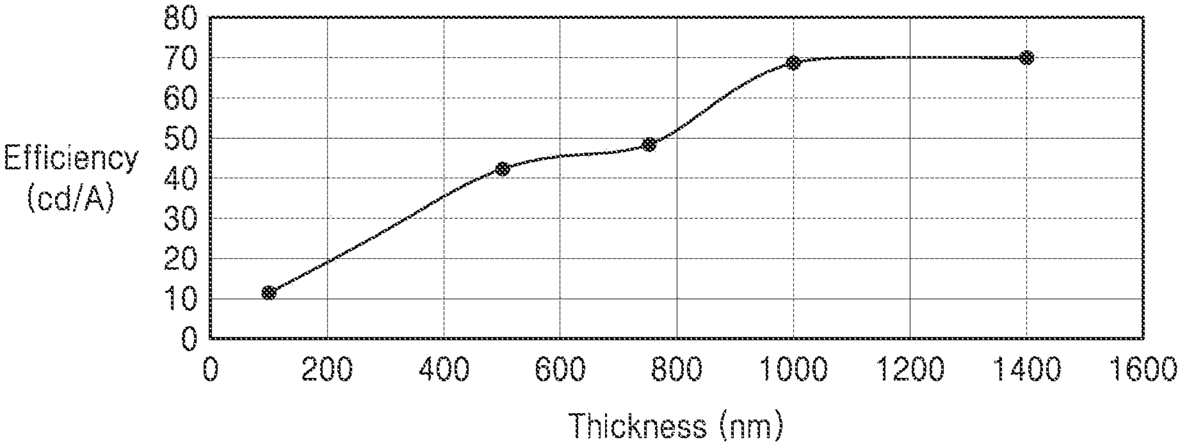

FIGS. 8A, 8B, and 8C are power efficiency graphs according to a thickness of an organic material layer for each sub-pixel. FIG. 8A is a power efficiency graph according to a thickness of a red sub-pixel configured to emit light of a wavelength in the second wavelength band, FIG. 8B is a power efficiency graph according to a thickness of a green sub-pixel configured to emit light of a wavelength in the third wavelength band, and FIG. 8C is a power efficiency graph according to a thickness of a blue sub-pixel configured to emit light of a wavelength in the first wavelength band.

Table 1 below shows a power efficiency according to a thickness of an organic material layer for each sub-pixel.

TABLE 1

| Thickness of organic material layer | Red sub-pixel power efficiency (cd/A) | Green sub-pixel power efficiency (cd/A) | Blue sub-pixel conversion efficiency (cd/A/y) |
|---|---|---|---|
| 100 | 4.1 | 16.7 | 11.7 |
| 500 | 4.8 | 21.6 | 42.2 |
| 750 | 6.8 | 29.6 | 48.5 |
| 1000 | 5.4 | 24.7 | 68.5 |
| 1400 | 5.2 | 23.5 | 69.6 |

Referring to FIGS. 8A to 8C and Table 1, the red sub-pixel has a maximum power efficiency of 6.8 cd/A when the thickness of the organic material layer is about 750 nm, and the green sub-pixel has a maximum power efficiency of 29.6 cd/A when the thickness of the organic material layer is about 750 nm. The blue sub-pixel has a maximum conversion efficiency of 69.6 cd/A/y when the thickness of the organic material layer is about 1400 nm. That is, the maximum power efficiencies of the red sub-pixel and the green sub-pixel have respectively increased by about 66% and about 77% compared to the minimum power efficiency, and the maximum conversion efficiency of the blue sub-pixel has increased by about 500% compared to the minimum conversion efficiency according to the thickness of the organic material layer.

Because the thickness of the organic material layer is different according to a material characteristic of a composition material forming each sub-pixel, in a display apparatus according to some embodiments, the thickness of the organic material layer is formed different for each sub-pixel, and accordingly, a light efficiency is relatively improved and relatively high-quality images may be displayed.

According to some embodiments, a display apparatus capable of displaying relatively high-quality images with relatively improved light efficiency may be implemented. However, the scope of embodiments according to the present disclosure is not limited by these characteristics.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims, and their equivalents.

What is claimed is:

1. A display apparatus comprising:
- a first substrate;
- a light-emitting diode layer over the first substrate and including a light-emitting diode configured to emit light of a wavelength in a first wavelength band;
- a color-converting layer on the light-emitting diode layer and including a quantum-dot layer or a light-transmissive layer overlapping the light-emitting diode;
- a second substrate over the first substrate between the light-emitting diode layer and the color-converting layer and including a groove in a surface thereof facing the first substrate, the groove overlapping the light-emitting diode; and
- an ion-supplying layer filling the groove.

2. The display apparatus of claim 1, wherein the ion-supplying layer includes a polymer having a carboxyl group.

3. The display apparatus of claim 1, wherein the ion-supplying layer includes polyacrylic acid.

4. The display apparatus of claim 1, further comprising a sealing member between the first substrate and the second substrate.

5. The display apparatus of claim 4, wherein the sealing member defines a cavity between the first substrate and the second substrate.

6. The display apparatus of claim 5, wherein the color-converting layer and the ion-supplying layer face each other with the cavity therebetween.

7. The display apparatus of claim 4, wherein the sealing member includes a light-curable resin.

8. The display apparatus of claim 1, wherein the surface of the second substrate in a direction to the first substrate is spaced apart in a thickness direction from a surface of the color-converting layer in a direction to the second substrate.

9. The display apparatus of claim 8, wherein a distance between a surface of the ion-supplying layer in a direction to the first substrate and a surface of the color-converting layer in a direction to the second substrate is greater than or equal to a distance between a surface of the second substrate in the direction to the first substrate and a surface of the color-converting layer in the direction to the second substrate.

10. A display apparatus comprising:
a first substrate;
a light-emitting diode layer over the first substrate and including a first light-emitting diode, a second light-emitting diode, and a third light-emitting diode each configured to emit light of a wavelength in a first wavelength band;
an encapsulation layer on the light-emitting diode layer;
a bank layer on the encapsulation layer and defining a first bank opening overlapping the first light-emitting diode, a second bank opening overlapping the second light-emitting diode, and a third bank opening overlapping the third light-emitting diode;
a first quantum-dot layer in the first bank opening and configured to convert light of a wavelength in the first wavelength band into light of a wavelength in a second wavelength band;
a second quantum-dot layer in the second bank opening and configured to convert light of a wavelength in the first wavelength band into light of a wavelength in a third wavelength band;
a second substrate over the first substrate such that the light-emitting diode layer, the encapsulation layer, and the bank layer are between the first substrate and the second substrate, wherein the second substrate includes a first groove overlapping the first light-emitting diode, a second groove overlapping the second light-emitting diode, a third groove overlapping the third light-emitting diode, each of the first groove, the second groove, and the third groove being defined in a surface thereof in a direction to the first substrate; and
an ion-supplying layer including a first organic material layer filling the first groove, a second organic material layer filling the second groove, and a third organic material layer filling the third groove.

11. The display apparatus of claim 10, wherein the ion-supplying layer includes a polymer having a carboxyl group.

12. The display apparatus of claim 10, wherein the ion-supplying layer includes polyacrylic acid.

13. The display apparatus of claim 10, further comprising a sealing member between the first substrate and the second substrate,
wherein the sealing member defines a cavity between the first substrate and the second substrate.

14. The display apparatus of claim 13, wherein the cavity is between the first quantum-dot layer and the first organic material layer and between the second quantum-dot layer and the second organic material layer.

15. The display apparatus of claim 10, further comprising a light-transmissive layer in the third bank opening and configured to transmit light of a wavelength in the first wavelength band.

16. The display apparatus of claim 15, wherein the first wavelength band is in a range of 450 nm to 495 nm, the second wavelength band is in a range of 625 nm to 780 nm, and the third wavelength band is in a range of 495 nm to 570 nm.

17. The display apparatus of claim 15, wherein a thickness of the third organic material layer is different from a thickness of the first organic material layer and a thickness of the second organic material layer.

18. The display apparatus of claim 15, wherein a thickness of the third organic material layer is greater than a thickness of the first organic material layer and a thickness of the second organic material layer.

19. The display apparatus of claim 18, wherein a thickness of the first organic material layer is equal to a thickness of the second organic material layer.

20. The display apparatus of claim 10, wherein a surface of the second substrate in a direction to the first substrate is spaced apart from each of a surface of the first quantum-dot layer in a direction to the second substrate and a surface of the second quantum-dot layer in the direction to the second substrate.

* * * * *